(12) United States Patent
Kim et al.

(10) Patent No.: US 6,812,765 B2
(45) Date of Patent: Nov. 2, 2004

(54) PULSED SIGNAL TRANSITION DELAY ADJUSTING CIRCUIT

(75) Inventors: Kyu-hyoun Kim, Suwon (KR); Dae-Hyun Chung, Yongin (KR)

(73) Assignee: Samsung Electronic Co., Ltd., Suwon (KR)

( * ) Notice: Subject to any disclaimer, the term of this patent is extended or adjusted under 35 U.S.C. 154(b) by 0 days.

(21) Appl. No.: 10/425,077

(22) Filed: Apr. 28, 2003

(65) Prior Publication Data

US 2003/0201810 A1 Oct. 30, 2003

Related U.S. Application Data

(63) Continuation of application No. 09/870,265, filed on May 29, 2001, now Pat. No. 6,614,278.

(51) Int. Cl.[7] .............................................. H03H 11/26
(52) U.S. Cl. ...................................... 327/263; 327/284
(58) Field of Search ................................ 327/263, 261, 327/262, 289, 284, 285, 281

(56) References Cited

U.S. PATENT DOCUMENTS

| | | | |
|---|---|---|---|
| 5,793,238 A | | 8/1998 | Baker ......................... 327/262 |
| 6,144,247 A | * | 11/2000 | Kim et al. ................... 327/525 |
| 6,614,278 B2 | * | 9/2003 | Kim et al. ................... 327/263 |

OTHER PUBLICATIONS

English Translation of Abstract from Japanese Patent No. JP3023710.
English Translation of Abstract from Japanese Patent No. JP60137122.
English Translation of Abstract from Japanese Patent No. JP62120117.
English Translation of Taiwanese Patent No. 395090.

* cited by examiner

*Primary Examiner*—Dinh T. Le
(74) *Attorney, Agent, or Firm*—Marger Johnson & McCollom, P.C.

(57) ABSTRACT

A delay circuit has an input node receives an input pulsed signal. A buffer transfers the input signal to a floating node. A detector outputs to an output node an output voltage that has a first level, if the voltage at the floating node is below a threshold, and a second level otherwise. Two similar branches are used, one for controlling delays in the rising transitions and one for controlling delays in the falling transitions. For each branch, a reference terminal carries a reference voltage for biasing the floating node. A capacitor and a switch are coupled between the reference terminal and the floating node. The switch opens and closes responsive to the output voltage. When it opens, it shorts out the capacitor. An optional phase detector and delay code generator may be in a feedback arrangement, for continuously adjusting the reference voltages.

13 Claims, 10 Drawing Sheets

| STAGE | VIN | VFN | VO | SWITCH |
|---|---|---|---|---|
| 1 | 0 | VDD | 0 | OFF |
| 2 | 0 → VDD | VDD → VLT | VDD | ON |
| 3 | VDD | VLT → 0 | VDD | ON |
| 4 | VDD | 0 | VDD | ON |
| 5 | VDD → 0 | 0 → VLT | VDD | ON |
| 6 | 0 | VLT → VDD | 0 | OFF |

PULSED SIGNAL TRANSITION DELAY ADJUSTING CIRCUIT

This application is a continuation of U.S. patent application Ser. No. 09/870,265 filed on May 29, 2001, now U.S. Pat. No. 6,614,278, which is herein incorporated by reference.

BACKGROUND OF THE INVENTION

1. Field of the Invention

The present invention is related to the field of integrated circuits, and more specifically to delay circuits for adjusting delays of pulsed signals.

2. Description of the Related Art

In integrated circuits there is a need to have a delay circuit to provide signal delays for various functions. Delay circuits can be found in internal clock generation for clock signals in dynamic random access memories (DRAMs), and also in power supplies of internal semiconductor chips for controlling the timing of pump voltages.

Figure 1:
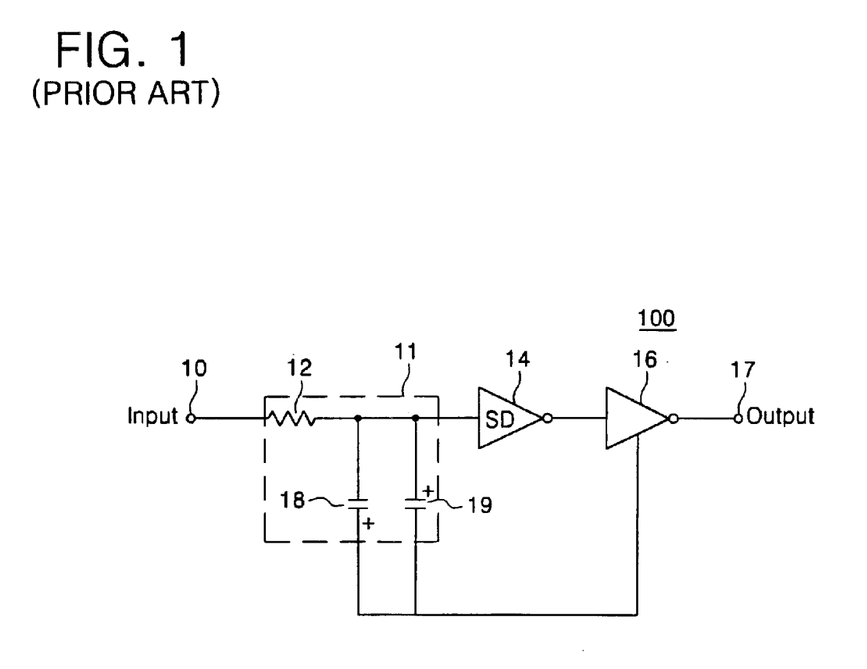
FIG. 1 is a diagram of the delay circuit in the prior art.

Referring now to FIG. 1, an example of such a delay circuit 100 is described. Circuit 100 is initially taught in the U.S. Pat. No. 5,920,221.

The voltage is input at a node 10, which is connected to an RC network 11. RC network 11 includes a resistor 12, and two directional, oppositely coupled capacitors 18, 19. The signal then passes through a signal detector 14 and an inverter circuit 16. The voltage output on a node 17 is fed back to capacitors 18, 19 of the RC network 11.

As the input signal rises and falls, the output signal rises and falls correspondingly, but with a certain delay. The delay in the rise is determined by the values of resistor 12 and capacitor 19. The delay in the fall is determined by the values of resistor 12 and capacitor 18.

A limitation of circuit 100 is that the delays in the rise and in the fall cannot be adjusted. That is because the elements that control the amount of rise and fall are part of the circuit.

Another limitation is that there is always an unwanted delay due to a minimum capacitance. This requires further design to avoid.

A problem with circuit 100 is that the feedback scheme permits noise to be coupled. This affects the waveforms, which in turn affects the performance of the overall device.

BRIEF SUMMARY OF THE INVENTION

The present invention overcomes these problems and limitations of the prior art.

Generally, the present invention provides a delay circuit that may be implemented as an integrated circuit. An input node receives an input signal, and a buffer transfers the input signal to a floating node. A detector outputs to an output node an output voltage that has a first level, if the voltage at the floating node is below a threshold, and a second level otherwise. The output voltage is thus a pulsed waveform, which follows the input signal.

The circuit of the invention includes a reference terminal that carries a reference voltage. A capacitor and a switch are coupled between the reference terminal and the floating node. The switch opens and closes responsive to the output voltage. When it opens, it shorts out the capacitor.

The invention offers the advantage that it permits adjusting the delay of the rising transitions and the falling transitions. The adjustment is by changing either the value of the reference voltage, or the capacitance, or both. Moreover, the adjustments are independent of each other.

The invention offers the additional advantage that, by shorting out the capacitor, it eliminates the unwanted delay due to a minimum capacitance. In addition, while the capacitor is shorted out, the coupling noise is eliminated. This makes design easier, along with improving performance.

In an optional embodiment, the circuit includes a phase detector and a delay code generator. These are in a feedback arrangement for continuously adjusting the reference voltages.

These and other embodiments and advantages of the invention will become more readily apparent from the following Detailed Description, which proceeds with reference to the drawings, in which:

DETAILED DESCRIPTION OF THE PREFERRED EMBODIMENT(S)

As has been mentioned, the present invention provides delay circuits. The invention is now described in more detail.

Figure 2:
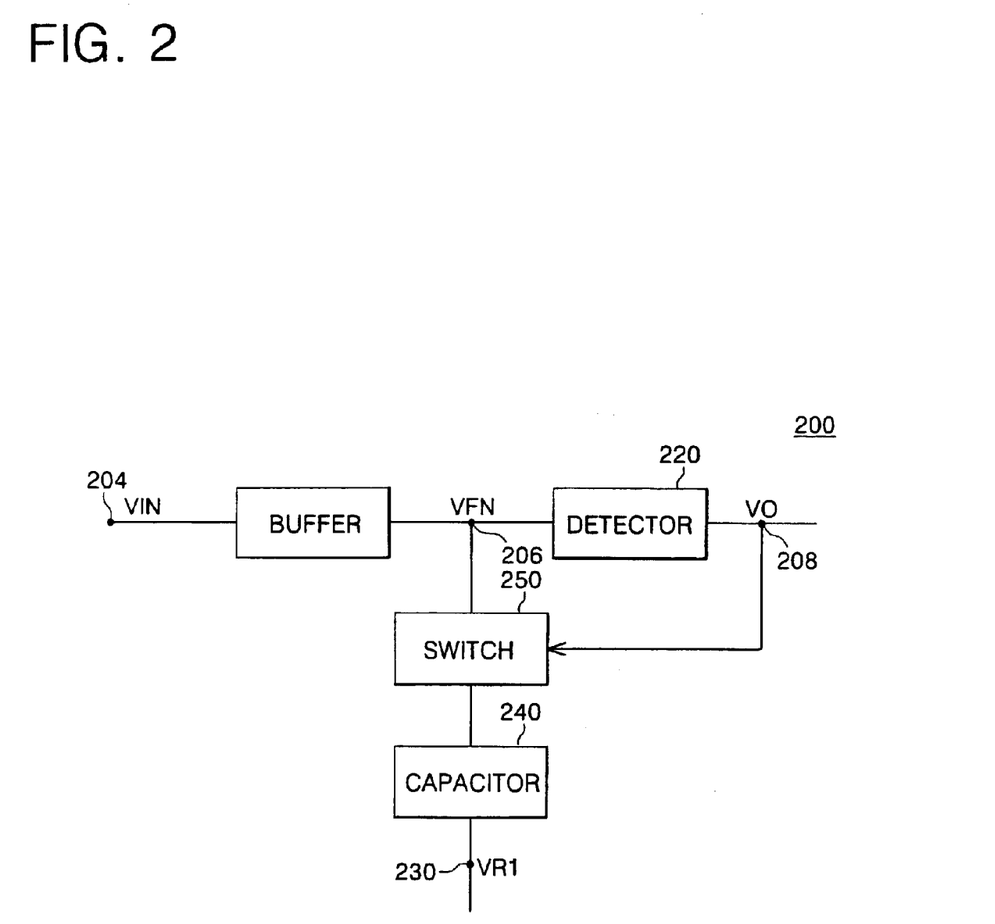
FIG. 2 is a block diagram of the circuit according to a general embodiment of the invention.

Referring now to FIG. 2, a circuit 200 is made according to a general embodiment of the invention. Circuit 200 includes an input node 204 for receiving input signal VIN. Circuit 200 also includes a floating node 206, and optionally an output node 208, on which the output voltage VO is generated.

A buffer 210 is coupled between input node 204 and floating node 206. Buffer 210 is preferably made by inverter.

Circuit 200 additionally includes a detector 220. Detector 220 outputs the output voltage VO on output node 208. Output voltage VO has a first level, such as a high level, if the voltage VFN at floating node 206 is below a threshold voltage VLT. Output voltage VO has a second level, such as a low level, otherwise. The high level may be a voltage supply level such as VDD, while the low level may be a ground level, such as 0V.

The output signal VO will therefore be a pulsed signal. This renders the circuit advantageous if the input signal VIN also has a pulsed waveform. Pulses are a succession of rising transitions and falling transitions. The timing of the rising and falling transitions of the output signal VO, relative to those of VIN, is controlled as described below.

Circuit 200 moreover includes a reference terminal 230. Reference terminal 230 carries a first reference voltage VR1. The first reference voltage may be any voltage according to the invention. Particularly advantageous values of VR1 are described below, along with ways of applying the first reference voltage to first reference terminal 230.

Circuit 200 additionally includes a capacitor 240, which is also known as first capacitor 240. Capacitor 240 is coupled between floating node 206 and first reference terminal 230. Capacitor 240 is made in any way known in the art. Many such ways are known for integrated circuits.

Circuit 200 further includes a switch 250, which is also known as first switch 250. Switch 250 is coupled between floating node 206 and first capacitor 240. Switch 250 opens and closes responsive to the first and second levels of output voltage VO. When it is open it shorts out capacitor 240, and also VR1, from floating node 206.

Figure 3A:
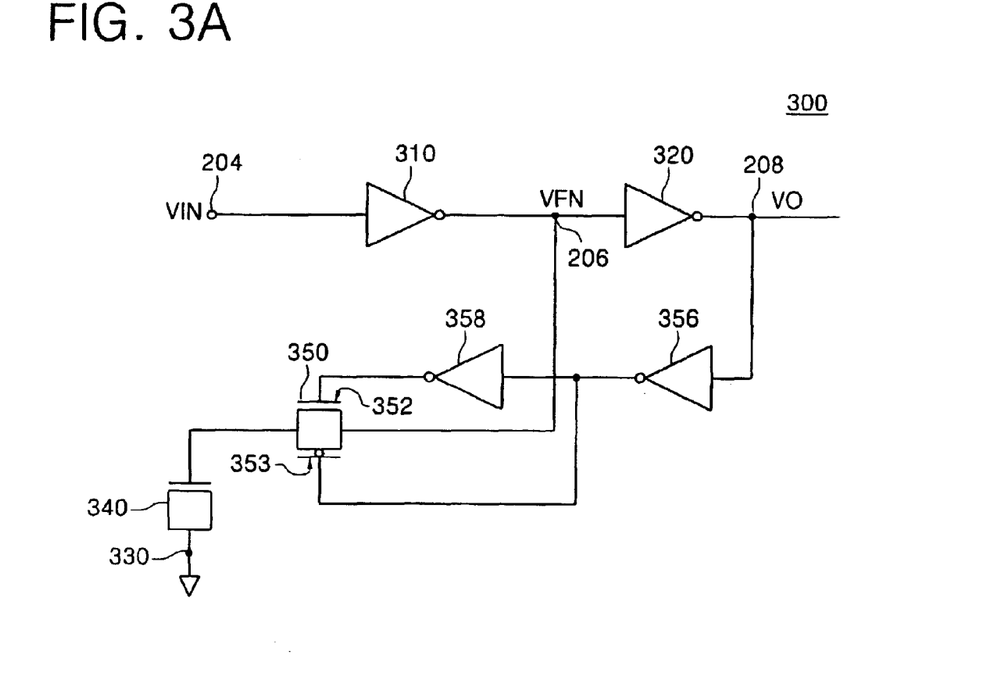
FIG. 3A is an electrical diagram of a particular embodiment of the block diagram of FIG. 2.

Referring now to FIG. 3A, a circuit 300 illustrates one of the preferred embodiments of the block diagram of FIG. 2. Circuit 300 has common elements with circuit 200, whose description will therefore not be repeated.

Inverter 310 implements buffer 210 of FIG. 2. Inverter 320 implements detector 220 of FIG. 2.

First reference terminal 330, corresponding to first reference terminal 230, is coupled to ground. In other words, first reference voltage VR1 will equal 0V in this embodiment.

Capacitor 340 is a field effect transistor for implementing first capacitor 240.

Complementary transfer gate 350 implements switch 250 of FIG. 2. Gate 350 is implemented by two field effect transistors 352, 353. These are controlled by the output voltage VO, through a pair of successive inverters 356, 358.

Figure 3B:
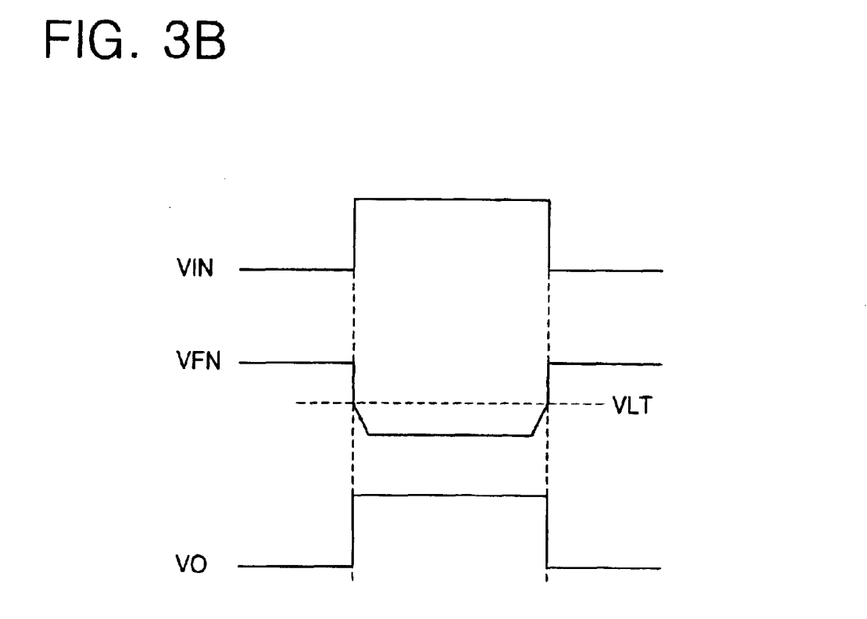
FIG. 3B is a timing diagram of key waveforms of the circuit of FIG. 3A.
Figure 3C:
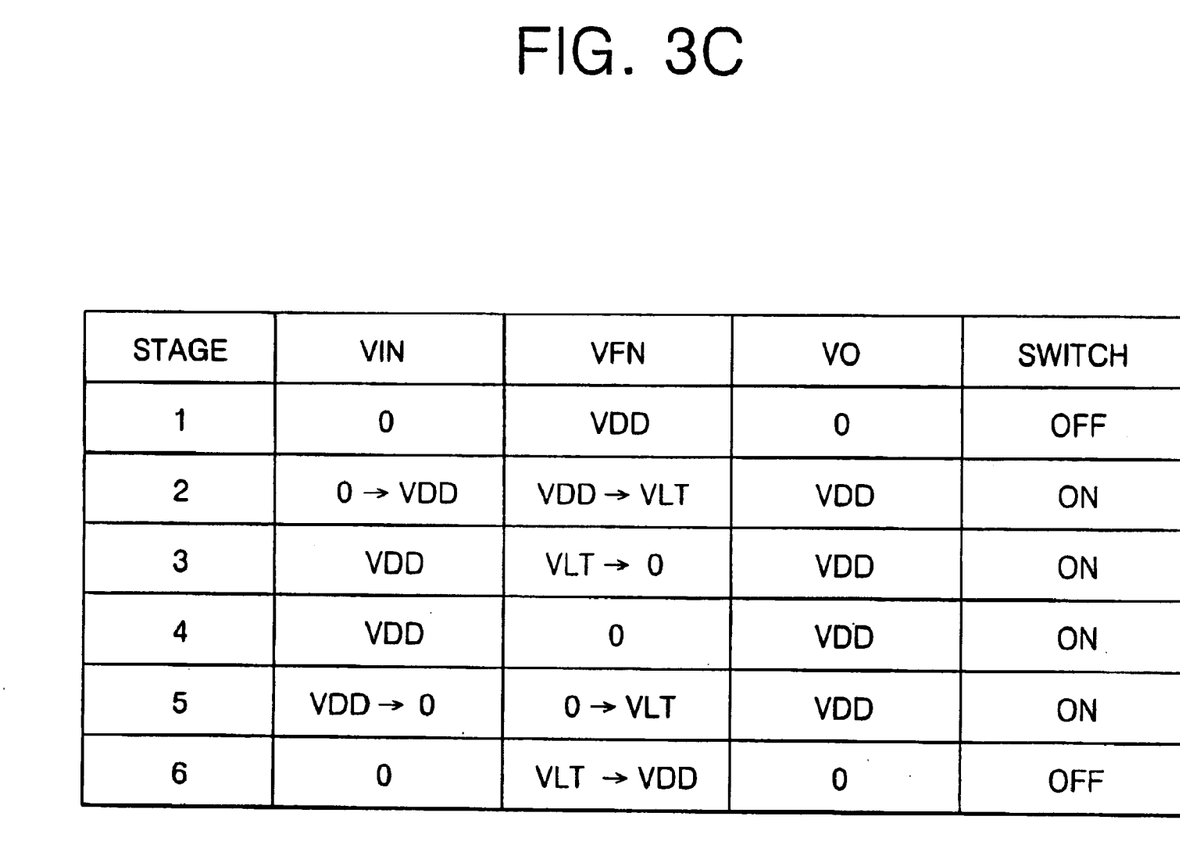
FIG. 3C is a table showing particular values of voltages during stages of the timing diagram of FIG. 3B.

Referring now to FIG. 3B and FIG. 3C, the behavior of circuit 300 is described. In FIG. 3B, a succession of waveforms illustrates a generation of the output voltage VO from the input voltage VIN. These take values from the table of FIG. 3C.

As can be discerned, input voltage VIN is seen as a pulse. Output voltage VO is a corresponding pulse, as could be expected from following two inverters 310, 320. Voltage VFN on floating node 206 changes suddenly, while the capacitor is shorted out, and slowly only when switch 350 is ON, or closed (stages 2–5 in FIG. 3C).

As a result, circuit 300 generates an output voltage VO, where only the falling transition is delayed, but not the rising transition. The amount of the delay in this embodiment is determined by the capacitance of capacitor 340.

Figure 4A:
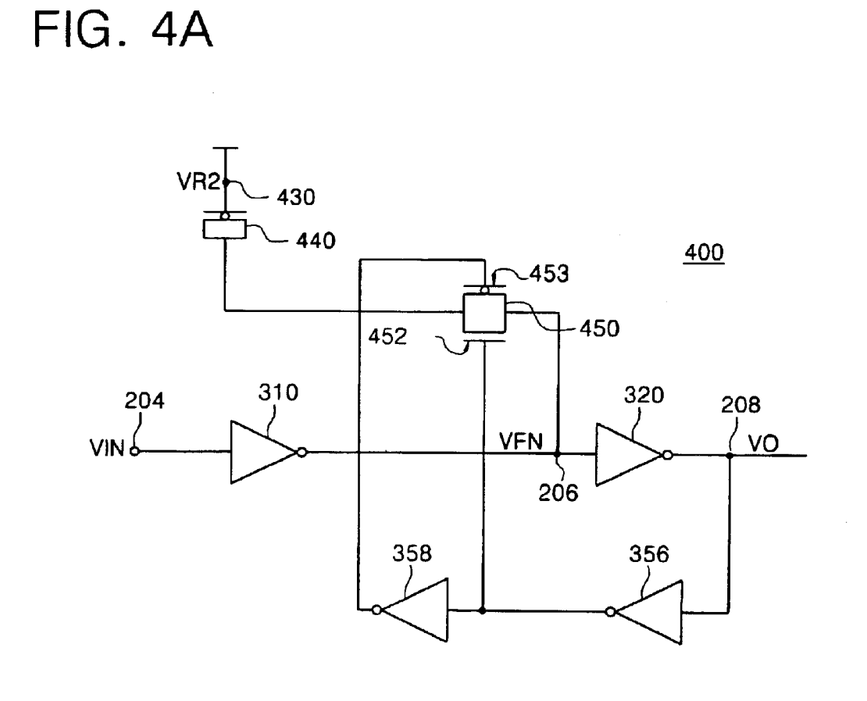
FIG. 4A is an electrical diagram of another particular embodiment of the block diagram of FIG. 2.

Referring now to FIG. 4A, another circuit 400 is described, that implements the block diagram of FIG. 2. Again, many components have descriptions similar to those of FIG. 2 and FIG. 3A, and therefore will not be discussed again.

Reference terminal 430, corresponding to first reference terminal 230, carries a second reference voltage VR2. Terminal 430 is coupled to a supply voltage, so VR2=VDD.

Capacitor 440 is a field effect transistor for implementing first capacitor 240.

Complementary transfer gate 450 implements switch 250 of FIG. 2. Gate 450 is implemented by two field effect transistors 452, 453. These are controlled by the output voltage VO, through successive inverters 356, 358. It will be observed that gate 450 is wired oppositely to gate 350.

Figure 4B:
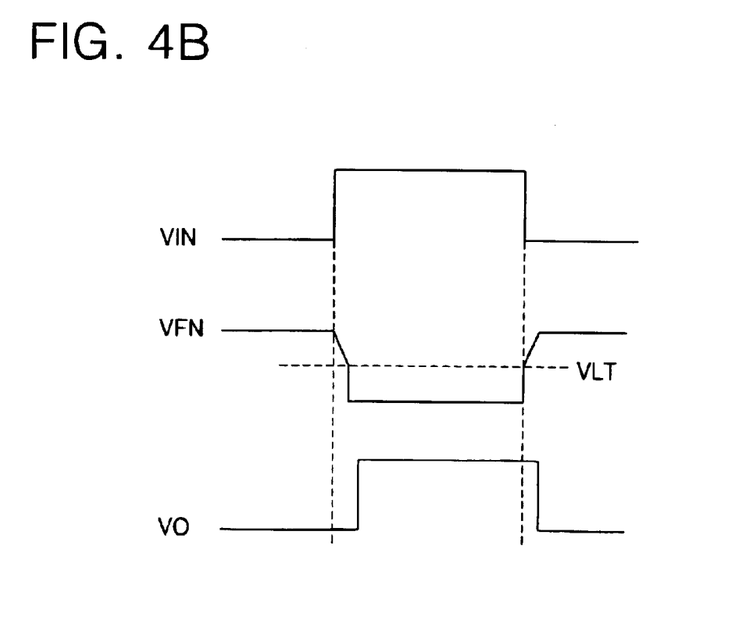
FIG. 4B is a timing diagram of key waveforms of the circuit of FIG. 4A.

Referring now to FIG. 4B, waveforms are given for describing the behavior of circuit 400. Compared especially to FIG. 3B, it will be observed that voltage VFN in FIG. 4B has abrupt transitions only when it is below VLT (owing to the value of VR2 and the wiring of gate 450).

Circuit 400 therefore generates an output voltage VO, where only the rising transition is delayed, but not the falling transition. The amount of the delay is determined by the capacitance of capacitor 440. The delay is different in FIG. 4B than in FIG. 3B, and that is because capacitor 440 has a different value than capacitor 430.

Figure 5:
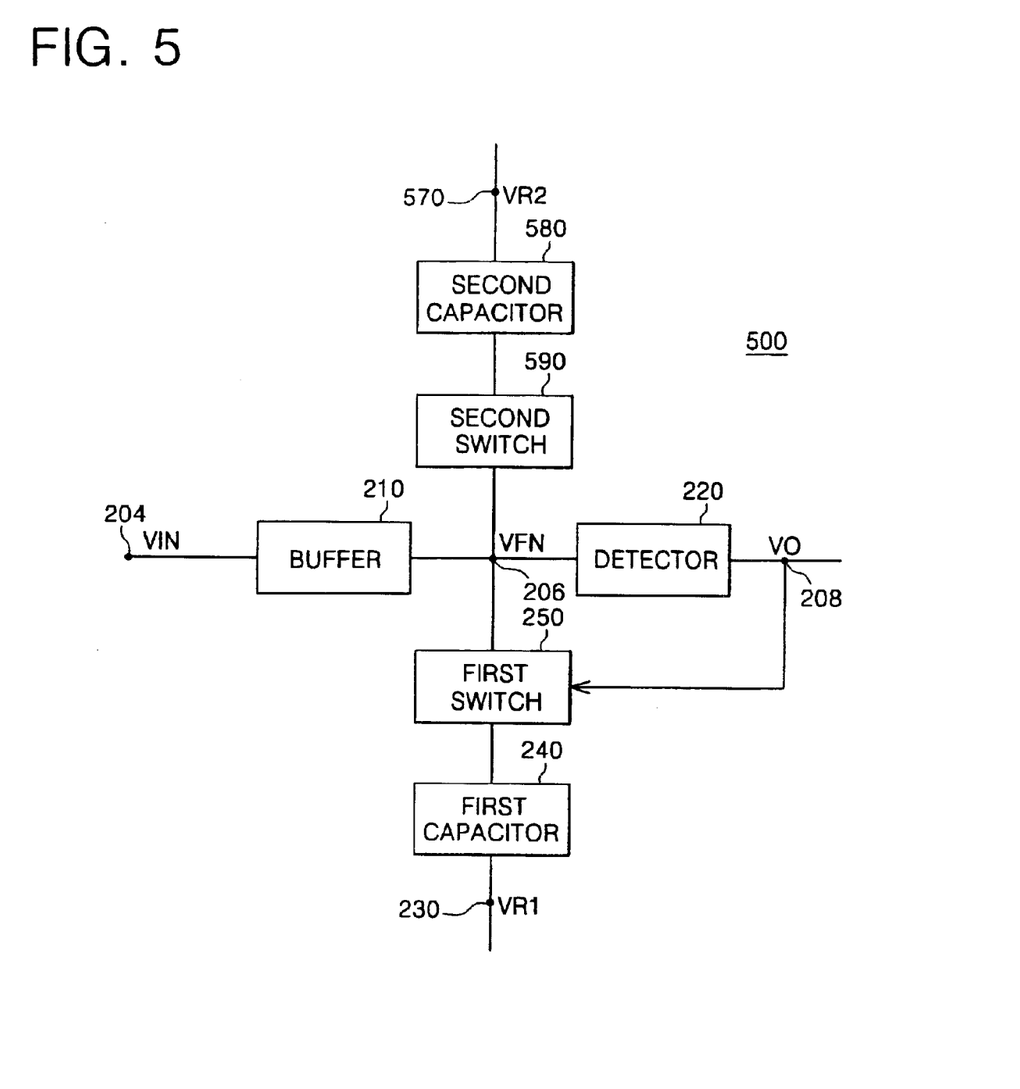
FIG. 5 is a block diagram of the circuit according to another general embodiment of the invention.

Referring now to FIG. 5, a circuit 500 is used to describe another general embodiment of the invention. It will be recognized that circuit 500 has many components in common with circuit 200 of FIG. 2.

In transitioning from circuit 200 to circuit 500, items known as "first" are included as "first", and included again as "second". But then again, words such as "first" and "second" are used in this document for mere labeling.

More particularly, circuit 500 has a second reference terminal 570, a second capacitor 580, and a second switch 590. The discussion of these items is identical to the discussion respectively of first reference terminal 230 and reference terminal 430, first capacitor 240 and capacitor 440, and first switch 250 and switch 350.

One of the main ideas in the circuit of FIG. 5 is to have two branches for controlling VFN, instead of just the one, that circuit 200 uses. Proper connections permit these two branches to operate independently of each other.

The first branch includes first reference terminal 230, first capacitor 240, and first switch 250. The first branch may be used for controlling the delay in the falling transition of the output voltage VO, as was shown in FIG. 3B, by circuit 300 of FIG. 3A.

The second branch includes second reference terminal 570, second capacitor 580, and second switch 590. The second branch may be used for controlling the delay in the rising transition of the output voltage VO, as was shown in FIG. 4B, by circuit 400 of FIG. 4A.

Figure 6A:
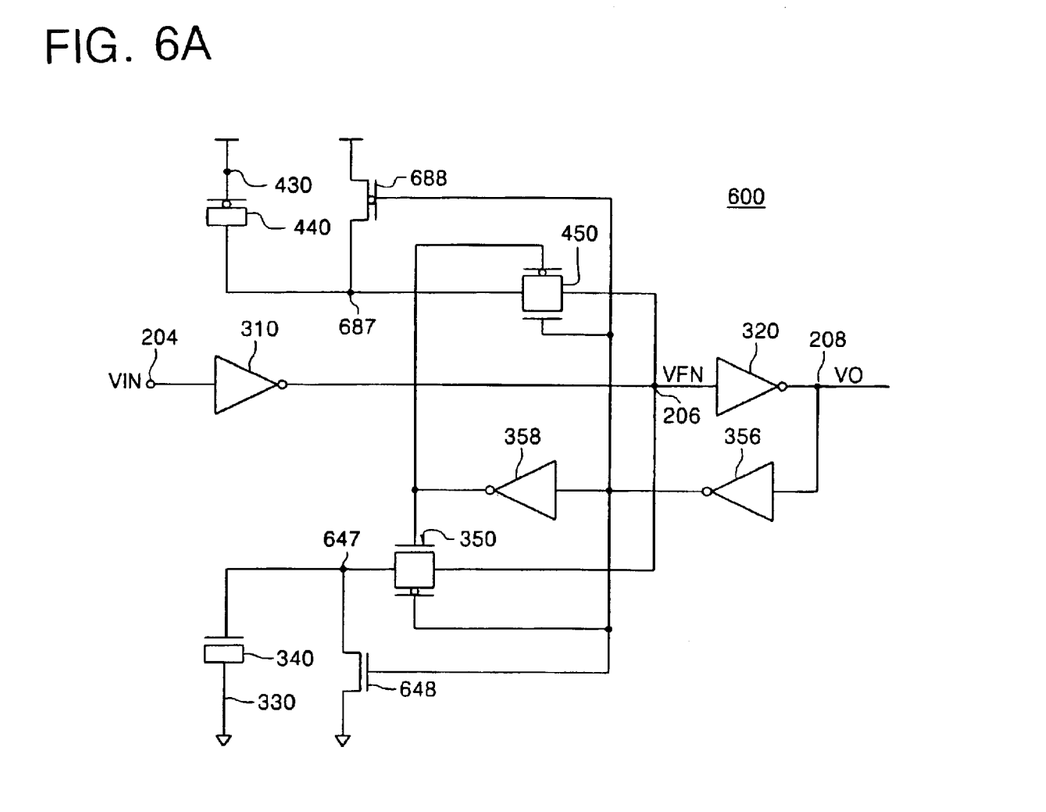
FIG. 6A is an electrical diagram of a particular embodiment of the block diagram of FIG. 5.

Referring now to FIG. 6A, a circuit 600 is used to describe an embodiment of block diagram 500, according to the main idea discussed above. Circuit 600 has components similar to those of circuits 300, 400.

Terminal 430, capacitor 440, complementary transfer gate 450 respectively implement terminal 570, capacitor 580, and switch 590. In addition, circuit 600 includes first and second precharge switches 648, 688. These are controlled by the output voltage VO, in this embodiment, via inverter 356. Switch 648 is for selectively shorting a node 647 between first capacitor 340 and first switch 350 to a ground in this embodiment. Switch 688 is for selectively shorting a node 687 between second capacitor 680 and second switch 690, to a supply voltage in this embodiment.

Figure 6B:
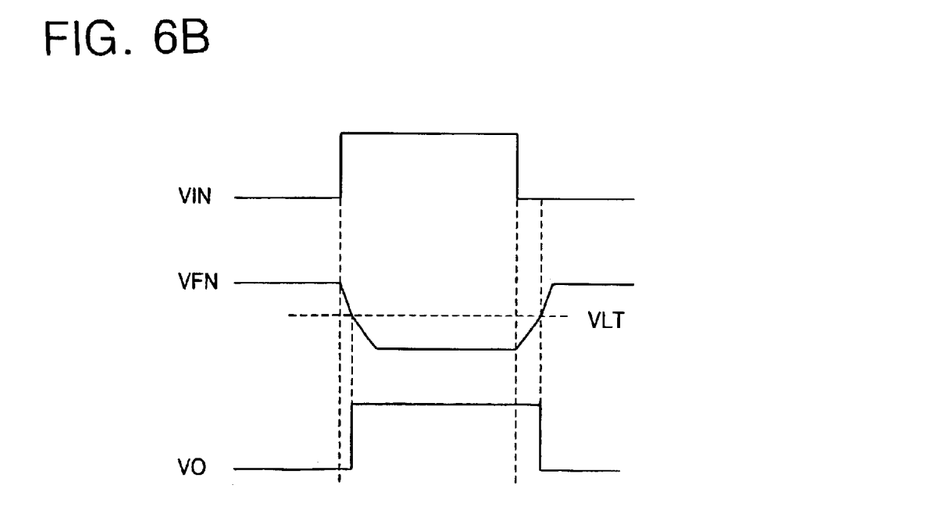
FIG. 6B is a timing diagram of key waveforms of the circuit of FIG. 6A.

Referring now to FIG. 6B, waveforms are given to describe the behavior of the output voltage VO with respect to the input voltage VIN. It will be recognized that the voltage VFN on floating node 206 is a composite of corresponding behaviors described in FIG. 3B (for voltage VFN below threshold voltage VLT), and in FIG. 4B (for voltage VFN above threshold voltage VLT). Indeed, only one of switches 350, 450 is closed at a time, thereby allowing only one of the respective capacitors 340, 440 to act at a time. Accordingly, output voltage VO is a composite of the output voltages of FIG. 4B (having the shorter delay in the rising transition), and of FIG. 3B (having the longer delay in the falling transition).

Figure 7:
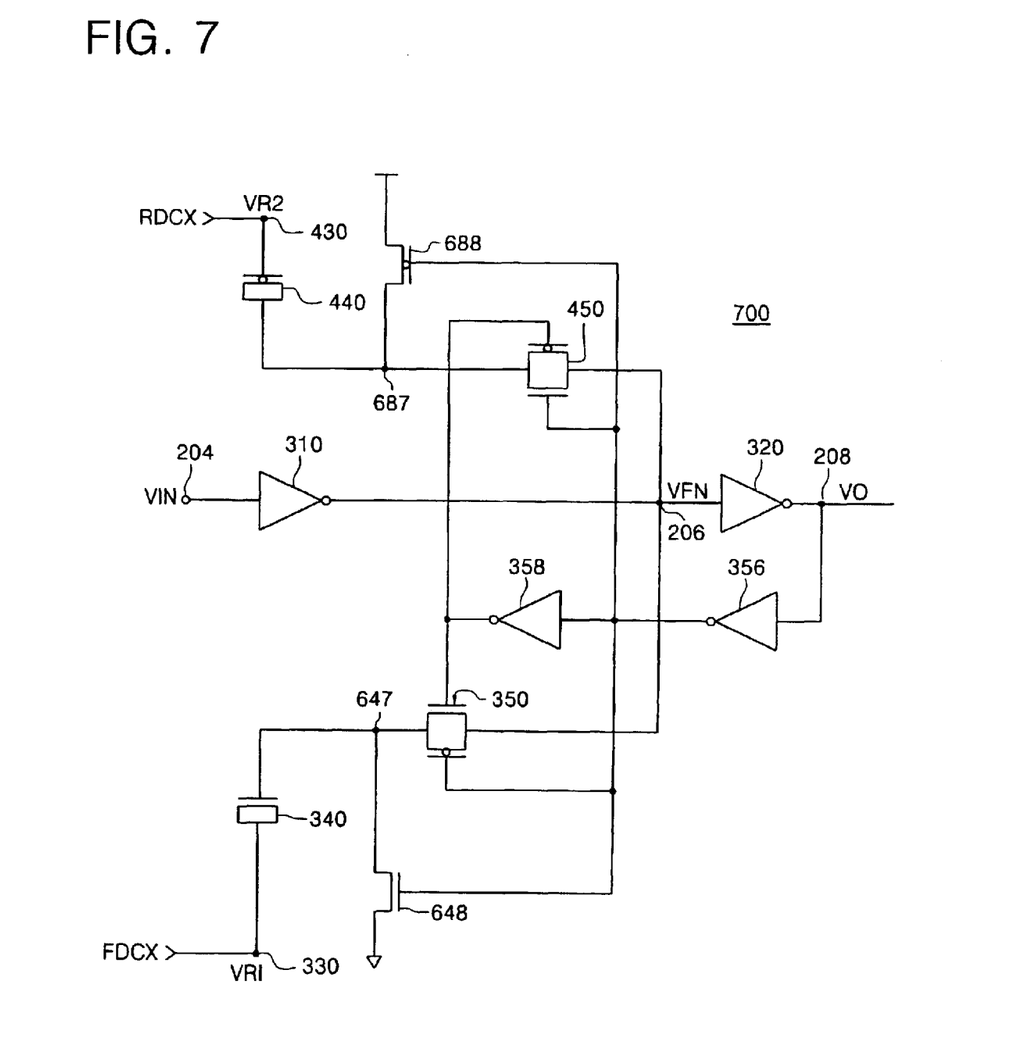
FIG. 7 is an electrical diagram of a circuit according to another particular embodiment of the block diagram of FIG. 5.

Referring now to FIG. 7, a circuit 700 is made according to yet another particular embodiment of FIG. 5. Circuit 700 has many components identical to those of FIG. 6, whose description will therefore not be repeated.

Circuit 700 has a reference terminal 430 (corresponding to reference terminal 570), which is also called a rising signal terminal. A capacitor 440 (corresponding to capacitor 580) is also called a rising capacitor. In addition, circuit 700 has a reference terminal 330 (corresponding to reference terminal 230), which is also called a falling signal terminal. A capacitor 340 (corresponding to capacitor 240) is also called a falling capacitor.

Importantly, in circuit 700, reference terminals 330, 430 are not necessarily coupled to fixed voltages. In addition, reference voltages VR2, VR1 may be applied from a rising delay control signal RDCX, and a falling delay control signal FDCX. Signals RDCX, FDCX may be analog, thereby varying the ultimate bias on floating node 206.

Accordingly, reference voltages VR2, VR1 may be changed dynamically, while circuit 700 is operating. This allows changing dynamically the rising and falling delays, respectively.

Figure 8:
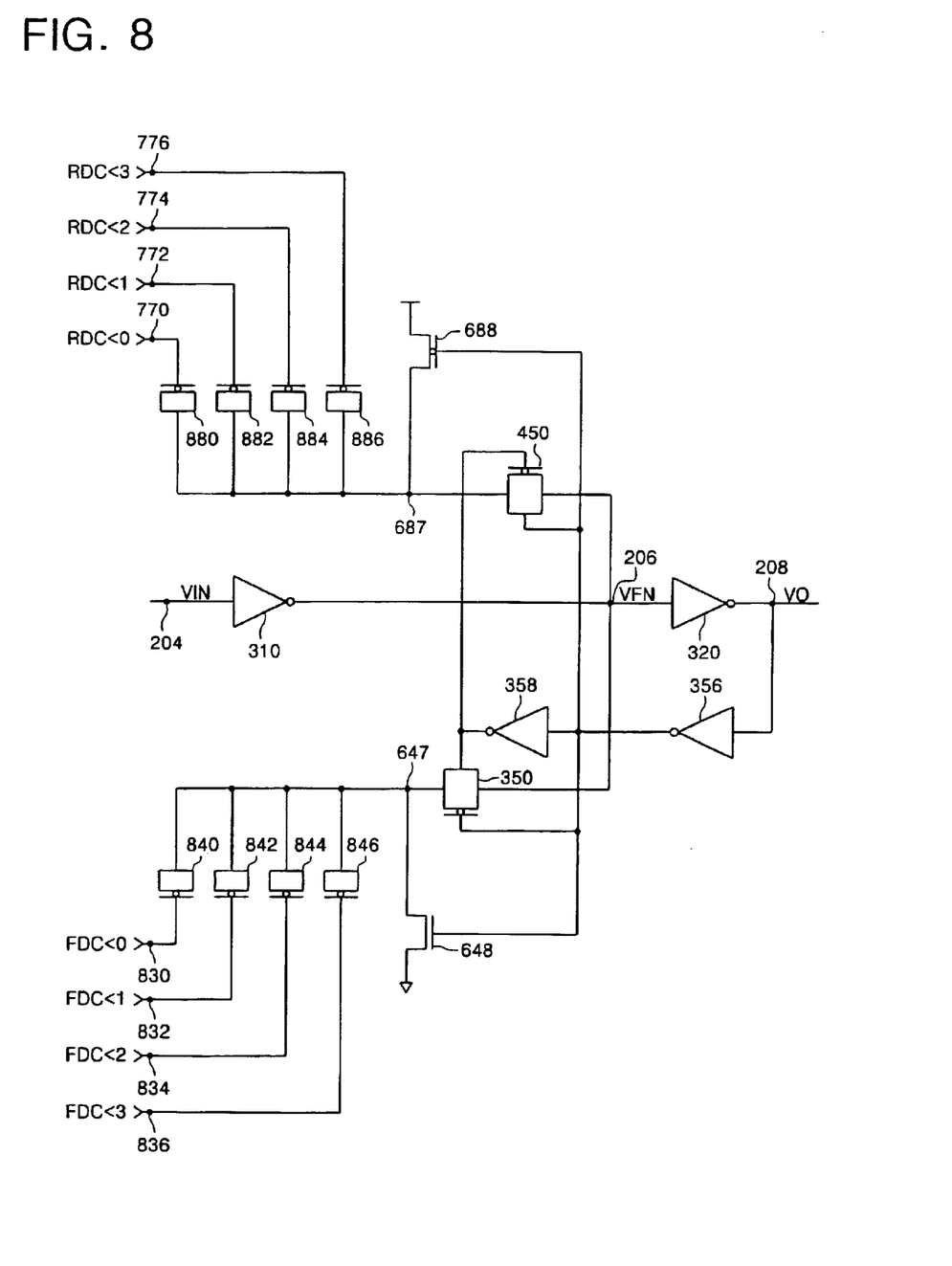
FIG. 8 is an electrical diagram of a circuit according to one more particular embodiment of the block diagram of FIG. 5.

Referring now to FIG. 8, a circuit 800 is made according to yet another particular embodiment of FIG. 5. Circuit 800 has many components identical to those of FIG. 6, whose description will therefore not be repeated.

Circuit 800 has reference terminals 830, 832, 834, 836 (corresponding to reference terminal 230), which are also called falling signal terminals. Circuit 800 also includes capacitors 840, 842, 844, 846, also called falling capacitors, coupled between respective falling signal terminals 830, 832, 834, 836 and node 647. It will be appreciated that, if the reference terminals 830, 832, 834, 836 are at the same voltage level, the capacitances of falling capacitors 840, 842, 844, 846 are added together.

Circuit 800 also has reference terminals 870, 872, 874, 876 (corresponding to reference terminal 570), which are also called rising signal terminals. Circuit 800 also includes capacitors 880, 882, 884, 886, also called rising capacitors, coupled between respective reference terminals 870, 872, 874, 876 and node 687. It will be appreciated that, if the reference terminals 870, 872, 874, 876 are at the same voltage, the capacitances of rising capacitors 880, 882, 884, 886 are added together.

In general, for circuit 800, the falling delay control signal FDC<0:3> and the rising delay control signal RDC<0:3> are digital. Each has bits that can attain a high or a low value.

In circuit 800, falling delay control signal FDC<0:3> has individual respective bits FDC<0>, FDC<1>, FDC<2>, FDC<3>, which are applied to falling signal terminals 830, 832, 834, 836 respectively. Rising delay control signal RDC<0:3> has individual respective bits RDC<0>, RDC<1>, RDC<2>, RDC<3>, which are applied to rising signal terminals 870, 872, 874, 876 respectively.

It is preferred that the rising and falling capacitors have staggered values. This way the falling delay control signal FDC<0:3> and the rising delay control signal RDC<0:3> can select the required amount of delay. A different number of bits may be implemented, depending on the desired precision.

Figure 9:
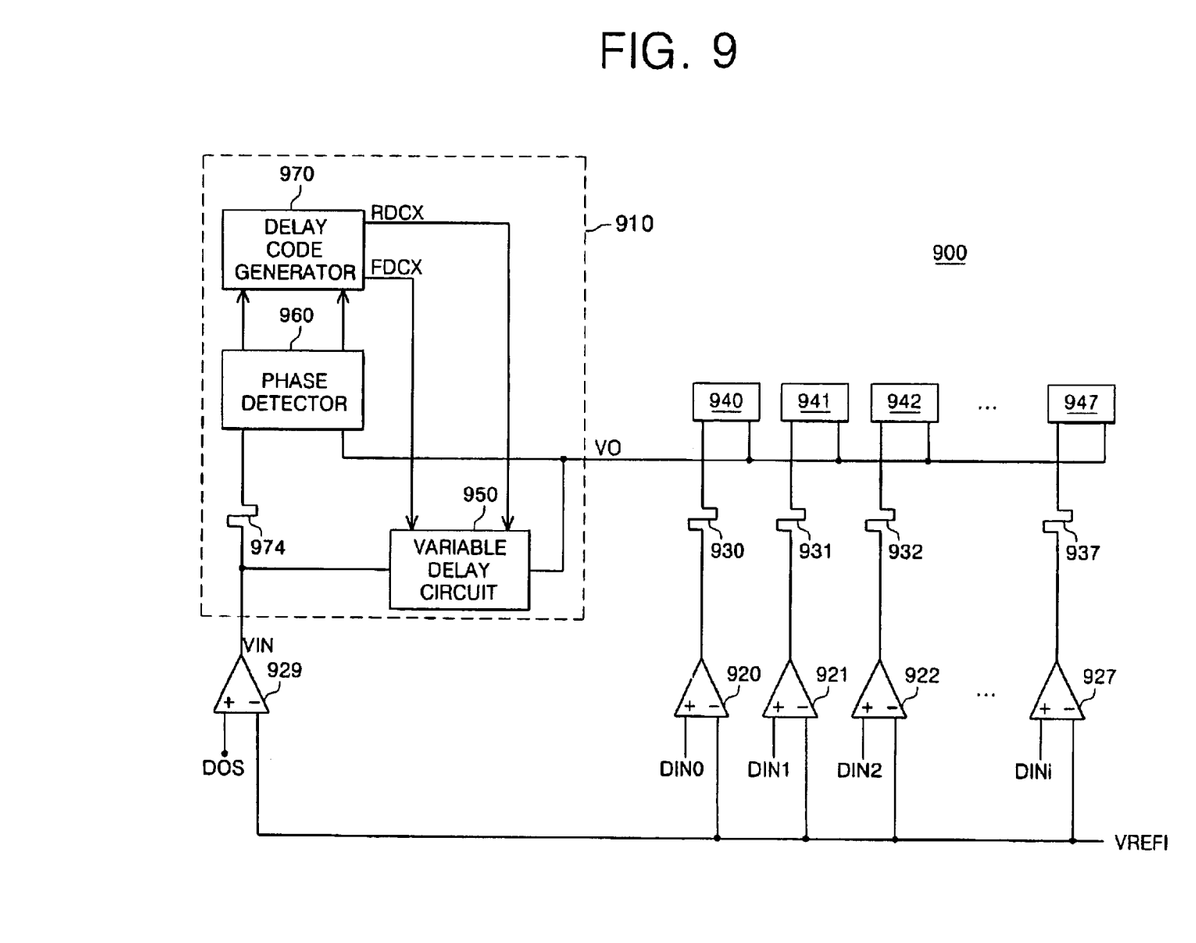
FIG. 9 is a diagram of a circuit according to yet another embodiment of the invention, that includes feedback.

Referring now to FIG. 9, a circuit according to another embodiment of the invention is described. FIG. 9 shows a portion 900 of an integrated circuit. A circuit 910 according to an embodiment of the invention is provided for synchronizing input data DIN0, DIN1, DIN2, . . . , DINi according to a strobe signal DQS with the aid of a reference voltage VREF1. It will be appreciated that circuit 910 of the invention uses feedback.

Data DIN0, DIN1, DIN2, . . . , DINi are first passed through respective detectors 920, 921, 922, . . . , 927, and then through respective delays 930, 931, 932, . . . , 937, before being inputted into respective latches 940, 941, 942, . . . , 947.

Latches 940, 941, 942, . . . , 947 are controlled by a signal VO output by circuit 910 of the invention. Strobe signal DQS preferably, but not necessarily passes through a detector 929 to provide the input signal VIN for circuit 910 of the invention.

Circuit 910 of the invention includes a variable delay circuit 950. This may be implemented as described above with reference to the block diagram of FIG. 5. It may be suited to receive a rising delay control signal RDCG at terminal 570, and a falling delay control signal FDCG at terminal 230. As described above, rising delay control signal RDCG and falling delay control signal FDCG may be analog or digital, with one or more bits.

Circuit 910 additionally includes a phase detector 960. Detector 960 senses a phase delay between rising transitions of the output signal VO and corresponding transitions of the input signal VIN to generate a rising sense signal RS. Detector 960 senses a phase delay between falling transitions of the output signal VO and corresponding transitions of the input signal VIN to generate a falling sense signal FS.

Circuit 910 moreover includes a delay code generator 970. Generator 970 generates the rising delay control signal RDCG responsive to the rising sense signal RS, and the falling delay control signal FDCS responsive to the falling sense signal FS.

Circuit 910 may optionally include a second delay circuit 974. Delay circuit 974 may delay the input signal VIN before it reaches phase detector 960. Its value is determined in conjunction with values of delays, 930, 931, 932, . . . , 937.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and subcombinations of features, functions, elements and/or properties may be presented in this or a related document.

The invention claimed is:

1. An integrated circuit comprising:

an input node for receiving an input signal;

a first node;

a first logic circuit coupled between the input node and the first node;

a second logic circuit coupled to the first node and for generating an output signal of a first level when a voltage at the first node is below a predetermined voltage, and of a second level otherwise;

a first capacitor coupled between the a first voltage and a second node;

a first switch coupled between the first node and the second node, the first switch controlled by the output signal;

a first precharge circuit controlled by the output signal for selectively precharging the second node between the first switch and the first capacitor.

2. The integrated circuit of claim 1, wherein the first voltage is a supply voltage.

3. The integrated circuit of claim 1, wherein the first voltage is a ground voltage.

4. The integrated circuit of claim 1, wherein the first logic and the second logic circuits are an inverter, respectively.

5. An integrated circuit comprising:
an input node for receiving an input signal;
a first node;
a first logic circuit coupled between the input node and the first node;
a second logic circuit coupled to the first node and for generating an output signal of a first level when a voltage at the first node is below a predetermined voltage, and of a second level otherwise;
a first signal terminal for receiving a first delay control signal for a rising delay of the output voltage with respect to the input signal;
a first capacitor coupled between the first signal terminal and a second node;
a first switch coupled between the first node and the second node, the first switch controlled by the output signal;
a first precharge circuit controlled by the output signal for selectively precharging the second node between the first switch and the first capacitor;
a second signal terminal for receiving a second delay control signal for a falling delay of the output voltage with respect to the input signal;
a second capacitor coupled between the second signal terminal and a third node;
a second switch coupled between the first node and the third node, the second switch controlled by the output signal.

6. The integrated circuit of claim 5, further comprising;
a third signal terminal for receiving a third delay control signal for a rising delay of the output voltage with respect to the input signal.

7. The integrated circuit of claim 6, further comprising:
a third capacitor coupled between the third signal terminal and the second node.

8. The integrated circuit of claim 5, further comprising;
a second precharge circuit controlled by the output signal for selectively precharging the third node between the second switch and the second capacitor.

9. The integrated circuit of claim 5, wherein, the first signal terminal is connected to a supply voltage.

10. The integrated circuit of claim 5, wherein, the second signal terminal is connected to a ground voltage.

11. The integrated circuit of claim 6, wherein, the third signal terminal is connected to a ground voltage.

12. The integrated circuit of claim 5, further comprising;
a fourth signal terminal for receiving a fourth delay control signal for a falling delay of the output voltage with respect to the input signal.

13. The integrated circuit of claim 12, wherein, the fourth signal terminal is connected to a supply voltage.

* * * * *

UNITED STATES PATENT AND TRADEMARK OFFICE
CERTIFICATE OF CORRECTION

PATENT NO.   : 6,812,765 B2
DATED        : November 2, 2004
INVENTOR(S)  : Kim et al.

It is certified that error appears in the above-identified patent and that said Letters Patent is hereby corrected as shown below:

Column 6,
Line 57, please replace "between the a first voltage and a" with -- between a first voltage and a --.

Signed and Sealed this

Sixth Day of December, 2005

JON W. DUDAS
*Director of the United States Patent and Trademark Office*